(12) United States Patent
Blanchard et al.

(10) Patent No.: US 11,145,717 B2
(45) Date of Patent: Oct. 12, 2021

(54) CELLULAR INSULATED GATE POWER DEVICE WITH EDGE DESIGN TO PREVENT FAILURE NEAR EDGE

(71) Applicant: Pakal Technologies, Inc., San Francisco, CA (US)

(72) Inventors: Richard A. Blanchard, Los Altos, CA (US); Vladimir Rodov, Seattle, WA (US); Woytek Tworzydlo, Austin, TX (US); Hidenori Akiyama, Miyagi (JP)

(73) Assignee: Pakal Technologies, Inc., San Francisco, CA (US)

( * ) Notice: Subject to any disclaimer, the term of this patent is extended or adjusted under 35 U.S.C. 154(b) by 38 days.

(21) Appl. No.: 16/587,265

(22) Filed: Sep. 30, 2019

(65) Prior Publication Data

US 2020/0105873 A1 Apr. 2, 2020

Related U.S. Application Data

(60) Provisional application No. 62/739,523, filed on Oct. 1, 2018.

(51) Int. Cl.
*H01L 29/06* (2006.01)
*H01L 29/423* (2006.01)
(Continued)

(52) U.S. Cl.
CPC ...... *H01L 29/0696* (2013.01); *H01L 29/0804* (2013.01); *H01L 29/0821* (2013.01); *H01L 29/1004* (2013.01); *H01L 29/36* (2013.01); *H01L 29/405* (2013.01); *H01L 29/41708* (2013.01); *H01L 29/4236* (2013.01); *H01L 29/7397* (2013.01)

(58) Field of Classification Search
CPC ............. H01L 29/7397; H01L 29/0696; H01L 29/0619; H01L 29/36; H01L 29/7811; H01L 29/4236; H01L 29/405; H01L 29/41708; H01L 29/0804; H01L 29/1004; H01L 29/0821
See application file for complete search history.

(56) References Cited

U.S. PATENT DOCUMENTS

5,457,329 A * 10/1995 Harada ................ H01L 29/749
257/153
10,418,441 B2 * 9/2019 Naito ...................... H01L 29/36
(Continued)

*Primary Examiner* — Errol V Fernandes
*Assistant Examiner* — Jeremy J Joy
(74) *Attorney, Agent, or Firm* — Patent Law Group; Brian D. Ogonowsky (57) ABSTRACT

A high power vertical insulated-gate switch is described that includes a parallel cell array having inner cells and an edge cell. The cells have a vertical npnp structure with a trenched field effect device that turns the device on and off. The edge cell is prone to breaking down at high currents. Techniques used to cause the current in the edge cell to be lower than the current in the inner cells, to improve robustness, include: forming a top n-type source region to not extend completely across opposing trenches in areas of the edge cell; forming the edge cell to have a threshold voltage of its field effect device that is greater than the threshold voltage of the field effect devices in the inner cells; and providing a resistive layer between the edge cell and a top cathode electrode electrically contacting the inner cells and the edge cell.

14 Claims, 7 Drawing Sheets

(51) Int. Cl.
*H01L 29/417* (2006.01)
*H01L 29/36* (2006.01)
*H01L 29/739* (2006.01)
*H01L 29/08* (2006.01)
*H01L 29/10* (2006.01)
*H01L 29/40* (2006.01)

(56) References Cited

U.S. PATENT DOCUMENTS

| | | | | |
|---|---|---|---|---|
| 2010/0155837 A1* | 6/2010 | Hebert | H01L 21/26513 | 257/334 |
| 2012/0153386 A1* | 6/2012 | Hirler | H01L 29/872 | 257/334 |
| 2013/0115739 A1* | 5/2013 | Akiyama | H01L 29/66378 | 438/137 |
| 2014/0034995 A1* | 2/2014 | Akiyama | H01L 29/0619 | 257/119 |
| 2014/0240025 A1* | 8/2014 | Blanchard | H01L 29/7393 | 327/376 |
| 2014/0240027 A1* | 8/2014 | Blanchard | H01L 29/1095 | 327/382 |
| 2014/0291724 A1* | 10/2014 | Voss | H01L 29/0696 | 257/140 |
| 2015/0349104 A1* | 12/2015 | Rodov | H01L 29/7455 | 257/133 |
| 2016/0197143 A1* | 7/2016 | Naito | H01L 21/26513 | 257/334 |
| 2017/0047395 A1* | 2/2017 | Blanchard | H01L 29/7397 | |
| 2017/0110535 A1* | 4/2017 | Yilmaz | H01L 29/1095 | |
| 2017/0256614 A1* | 9/2017 | Akiyama | H01L 29/0839 | |
| 2018/0182754 A1* | 6/2018 | Naito | H01L 21/76 | |
| 2018/0204938 A1* | 7/2018 | Liu | H01L 29/66348 | |
| 2019/0115436 A1* | 4/2019 | Hossain | H01L 29/0696 | |
| 2020/0105873 A1* | 4/2020 | Blanchard | H01L 29/36 | |
| 2020/0168601 A1* | 5/2020 | Takahashi | H01L 29/0619 | |

\* cited by examiner

CELLULAR INSULATED GATE POWER DEVICE WITH EDGE DESIGN TO PREVENT FAILURE NEAR EDGE

CROSS-REFERENCE TO RELATED APPLICATIONS

This application claims priority to U.S. provisional patent application Ser. No. 62/739,523, filed Oct. 1, 2018, by Richard Blanchard et al., assigned to the present assignee and incorporated herein by reference.

FIELD OF THE INVENTION

This invention relates to high power, insulated-gate-controlled devices used as switches and, more particularly, to a technique to reduce the current flow in edge areas surrounding a cellular array (active region) to prevent damage to the device when switching the device off, as well as to reduce turn-off time.

BACKGROUND

The present invention is directed to improvements in the active-cell edge area of vertical, insulated-gate-controlled devices, such as Insulated Gate Bipolar Transistors (IGBTs), Insulated Gate Turn-off Devices (IGTOs), thyristors, and other related devices that switch between an on state and an off state to control power to a load, such as a motor. Such devices may conduct many amps and have a breakdown voltage in excess of 500 volts.

The goal in such insulated-gated power devices is to obtain the lowest voltage drop that is compatible with reliable operation. In both IGBTs and IGTOs, the behavior of the portion of the device near the "discontinuous" edge cell of the active region may result in unwanted device failure due to the simultaneous combination of high current flowing through the edge cell and the voltage that is present. It is well known that, when such insulated-gate devices are turned off while conducting a high current, a failure can occur in its edge area.

Figure 1:
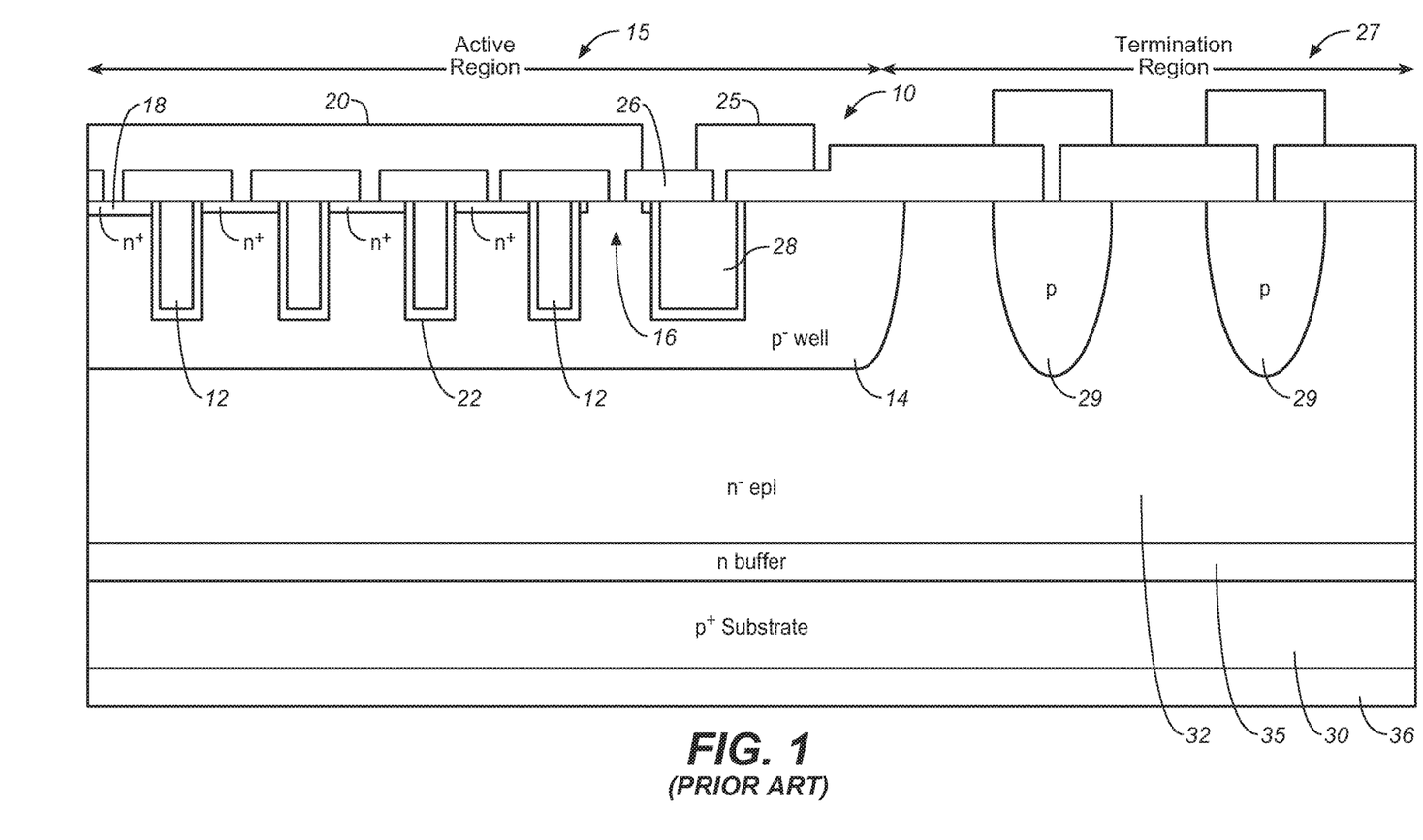
FIG. 1 is a cross-sectional view of the assignee's prior art vertical insulated-gate switch from U.S. Pat. No. 8,878,237, used to illustrate one possible device that can be improved using the present invention.
Figure 2:
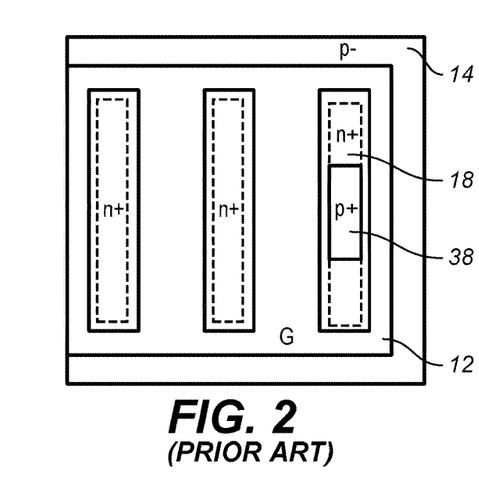
FIG. 2 is a top view of an edge portion of the device of FIG. 1, disclosed in U.S. Pat. No. 8,878,237, showing how an edge cell can be formed to improve the robustness of the device.

One way to reduce the current in the edge cell to improve robustness is shown in FIGS. 1 and 2, described in the assignee's U.S. Pat. No. 8,878,237, incorporated herein by reference.

FIG. 1 is a cross-section of a small portion of an IGTO device 10. The portion is near an edge of the device and shows a plurality of cells having vertical gates 12 (e.g., doped polysilicon) formed in insulated trenches, forming field effect devices. (The gates do not form field effect transistors since there is no inversion channel that extends completely between a source and drain.) A 2-dimensional array of the cells may be formed in a common p-well 14, and the cells are connected in parallel. The area containing the cells is shown as the active region 15. The edge of the active region 15 suffers from field crowding, and the edge cell is modified to increase ruggedness of the device. The edge cell has an opening 16 in the n+ source region 18 where the cathode electrode 20 shorts the n+ source region 18 to the p-well 14. Such shorting increases the tolerance to transients to prevent unwanted turn on (i.e., prevent high emitter-base voltages) and prevents the formation of hot spots. The removal of part of the n+ source region 18 in the edge cell also reduces the current near the edge. The edge cell may surround the active region 15, or there may be separate edge cells along two or more edges of the cell array.

The vertical gates 12 are insulated from the p-well 14 by an oxide layer 22. A p+ contact (not shown) may be used at the opening 16 of the edge cell for improved electric contact to the p-well 14. The narrow gates 12 are connected together outside the plane of the drawing and are coupled to a gate voltage via the gate electrode 25 contacting the polysilicon portion 28. A patterned dielectric layer 26 insulates the metal from the various regions. The field limiting rings 29 at the edge of the cell in the termination region 27 reduce field crowding, thereby increasing the breakdown voltage. The termination region 27 is designed to break down at a voltage higher than the breakdown voltage of the active region 15, since the cathode electrode 20 is over the active region 15 and can efficiently conduct the breakdown current. The termination region 27 surrounds the active region 15, which may have a generally rectangular shape. The active region 15 may take up the center area of a die or may be formed in strips separated by termination regions 27.

An npnp semiconductor layered structure is formed in FIG. 1. There is a bipolar pnp transistor formed by a p+ substrate 30, an n-epitaxial (epi) layer 32, and the p-well 14. There is also a bipolar npn transistor formed by the n-epi layer 32, the p-well 14, and the n+ source region 18. An n-type buffer layer 35, which may be epitaxially grown or formed by implantation into the substrate 30, has a dopant concentration higher than that of the n-epi layer 32. The buffer layer 35 helps to set the breakdown voltage and reduces hole injection into the n-epi layer 32. A metal anode electrode 36 contacts the substrate 30, and a metal cathode electrode 20 contacts the n+ source region 18. The p-well 14 surrounds the gate structure, and the n-epi layer 32 extends to the surface around the p-well 14.

When the anode electrode 36 is forward biased with respect to the cathode electrode 20, but without a sufficiently positive gate bias, there is no current flow, since the product of the betas (gains) of the pnp and npn transistors is less than one (i.e., there is no regeneration activity). This is achieved by selecting the proper doping profile in the p-well 14.

When the gate is forward biased, electrons from the n+ source region 18 become the majority carriers along the gate sidewalls in an inversion layer, referred to as a "voltage induced emitter," causing the effective width of the npn base (the portion of the p-well 14 between the n-layers) to be reduced. The inversion layer produces free electrons that are injected into the p-well 14. As a result, the beta of the npn transistor increases to cause the product of the betas to exceed one. This condition results in device turn-on, with holes being injected into the lightly doped n-epi layer 32 and electrons being injected into the p-well 14. Accordingly, the gate bias initiates the turn-on, and the full turn-on (due to regenerative action) occurs when there is current flow through both the npn transistor and the pnp transistor.

When the gate bias is removed, such as the gate electrode 25 being shorted to the cathode electrode 20, the IGTO device turns off.

FIG. 2 is also disclosed in U.S. Pat. No. 8,878,237 and is a top down view of the last three cells in the active region 15. The cells in this example are formed as elongated strips within the p-well 14. The cross-section of FIG. 1 is taken across the middle of FIG. 2. As seen, the end cell has an opening in the n+ source region 18 in which a p+ contact region 38 is formed in the p-well 14. The contact area of the metal cathode electrode 20 is shown by dashed lines. Note that the p+ contact region 38 does not extend laterally between the gates, so there is a continuous n+ portion surrounding the p+ contact region 38.

The shorting of the p-well 14 and n+ source region 18 by the cathode electrode 20 in the edge cell, and the partial removal of the n+ source region in the edge cell, increases the tolerance to transients to prevent unwanted turn on, prevents the formation of hot spots, reduces the current near the edge (since the n+ emitter is smaller), and reduces turn-off time due to carriers being more quickly removed by the cathode electrode 20 via the p+ contact region 38. Although the configuration of the edge cell in FIG. 2 performs adequately, it is desirable to further improve the configuration of the edge of the active area to further improve the robustness of the device of FIG. 1 or any other cellular IGBT, IGTO, thyristor, etc.

SUMMARY

In a first technique, the performance of an insulated-gate device similar to that of FIG. 1 is improved by various configurations of the top n+ source region of the edge cell. Simulations have shown surprising improvements in performance by extending the p+ contact region completely between the gates in the edge cell, which makes the n+ source region perimeter in the edge cell discontinuous. This controllably lowers the current conducted by the edge cell. Also, the cathode electrode contact area in the edge cell may be reduced, compared to the contact areas for the active cells, to lower the current in the edge cell. Further, two or three cells near the edge may be formed to have progressively lower current densities to further improve ruggedness. Current density is the electric current per cross-sectional area. The configurations of the edge cell may be applied to insulated-gate devices other than the type shown in FIG. 1, such as IGBT, IGTO, or thyristor devices.

In a second technique to reduce the current density in the edge area of a cell array, the threshold voltage of the field effect device in the edge cell is increased. Since all cells receive the same gate voltage, this means that the inner cells will conduct a higher current than the edge cell. This lower current in the edge cell improves the robustness of the device. Various techniques are described to increase the threshold voltage of the field effect device in the edge cell, relative to the threshold voltage of the inner cells. Such techniques include a masked angled implantation of boron (p-type) ions, phosphorus (n-type) ions, positive ions, or negative ions in the trench sidewalls or gate oxide, prior to the trenches being filled with polysilicon, to adjust the relative threshold voltages of the field effect devices.

In a third technique to reduce the current density in the edge area of a cell array, a resistive layer is formed between the cathode electrode and the edge cell to increase the series resistance of the edge cell. Such a layer may be a resistive ceramic/metal (called cermet) or a resistive metal layer formed over the edge cell that add resistance between the cathode electrode and the edge cell.

The three techniques may be used separately or in conjunction. There are different fabrication issues for each technique.

The techniques may be used with many different types of cell arrays in a vertical insulated-gate device.

The various techniques can be applied to different types of vertical, insulated gate devices.

Elements that are the same or equivalent are labelled with the same numerals.

DETAILED DESCRIPTION

The invention is directed to an improved edge area of an active region in a cellular vertical, insulated-gate device, such as an IGBT, IGTO, or thyristor device. The invention is particularly useful for high power devices used as switches. Three different techniques are used to reduce the current density only in the edge cells, while the device is on, to improve the robustness of the device. The three techniques are generally: 1) provide openings in the n+ source region between gates in the edge cell so the cathode electrode directly contacts the p-well (or a p+ contact region for the p-well) to reduce the current density in the edge cell; 2) increase the threshold voltage of the field effect device only in the edge cell, using doping techniques, to reduce the current density in the edge cell; and 3) form a resistive layer between the cathode electrode and the edge cell to reduce the current density in the edge cell. Variations of these techniques are also described.

FIGS. 3-10 relate to the first technique. FIGS. 11-20 relate to the second technique. And FIG. 21 relates to the third technique.

The various techniques can be applied to any type of cellular, vertical insulated-gate device, and the various techniques will be applied to the device of FIG. 1 as an example of a complete device. The general operation of the device of FIG. 1, previously described, also applies to the modified device, since the invention only affects the relative current density in the edge area of the active region. The cross-section of FIG. 1 can be used to represent some of the modified embodiments, depending on where the cross-section is taken across an edge cell.

Simulations have confirmed that the various modifications to the configuration of the p+ contact region 38 of FIG. 2 within the edge cell may provide an improvement in the ruggedness of the device. Such improvements are surprising results.

Figure 3:
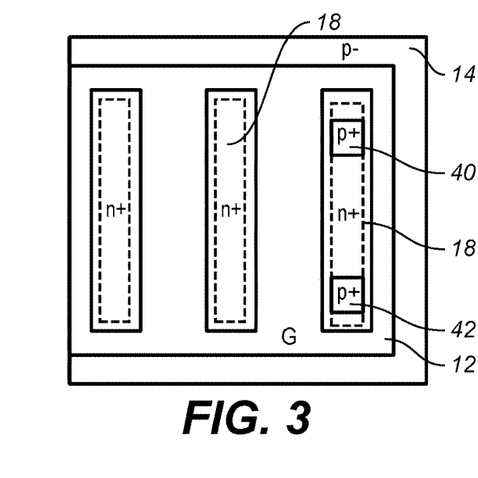
FIGS. 3-8 are top down views of different configurations of the edge cell in the active region in FIG. 1, where p+ contact regions are formed between the edge cell gates, using a first type of technique, to improve the robustness of an insulated-gate device, such as the device of FIG. 1.

In FIG. 3, the edge of a cellular active region, such as the edge of the active region 15 in FIG. 1, is shown. In an actual device using cells formed as strips, the cells would be much longer and there would be many more active cells. All cells are connected in parallel.

In contrast to the prior art FIG. 2, where there is only a center p+ contact region 38 surrounded by the n+ source region 18, FIG. 3 shows two separated p+ contact regions 40 and 42 within the n+ source region 18 in the edge cell. The dashed line shows the contact area of the cathode electrode 20 (FIG. 1), which is an opening in a dielectric layer over the active region. Distributing the p+ contact regions 40 and 42 within the edge cell creates a more uniform electric field and more uniformly reduces the current density in the edge cell to increase robustness. The current is reduced since the n+ source regions 18 act as emitters in the vertical npn transistors, and reducing the size of the n+ emitter reduces the current flow in the edge cell. Note that the p+ contact regions 40 and 42 do not extend completely between the gates 12, resulting in the n+ source region having a continuous perimeter for conducting current.

Figure 4:
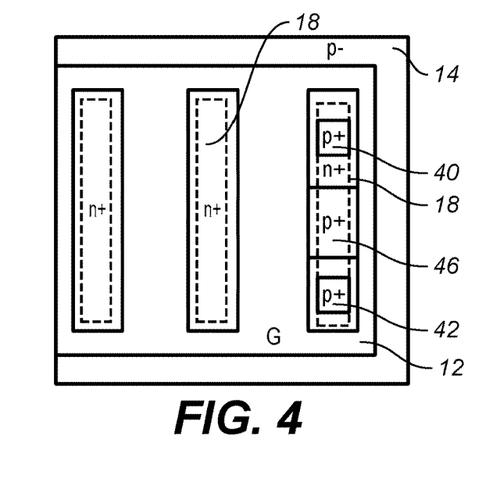

In FIG. 4, a p+ contact region 46 is added, where the p+ contact region 46 extends completely between the opposing gates 12. Therefore, the n+ source region 18 perimeter is discontinuous, resulting in a significant reduction in the current in the edge cell. Not only is the beta of the npn transistor reduced (by a reduced n+ emitter size), but the resistance of the vertical field effect device is increased by the reduction in the perimeter of the n+ source region 18.

Figure 5:
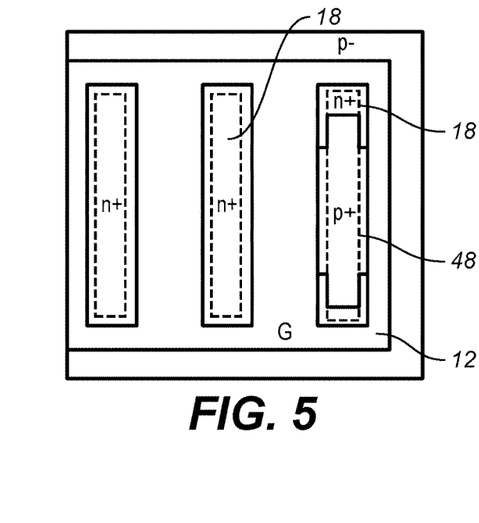

In FIG. 5, the p+ contact region 48 basically merges the p+ contact regions 40, 42, and 46 from FIG. 4, with all the benefits discussed with respect to FIG. 4.

Figure 6:
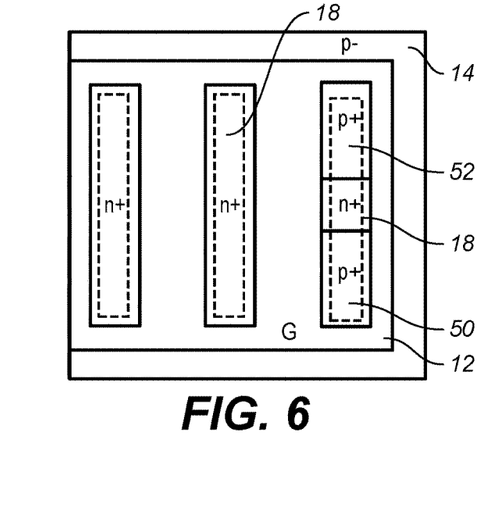

In FIG. 6, the p+ contact regions 50 and 52 are at both ends of the edge cell, and the perimeter of the n+ source region 18 is greatly reduced, resulting in an edge cell with much lower current density than an inner cell.

Figure 7:
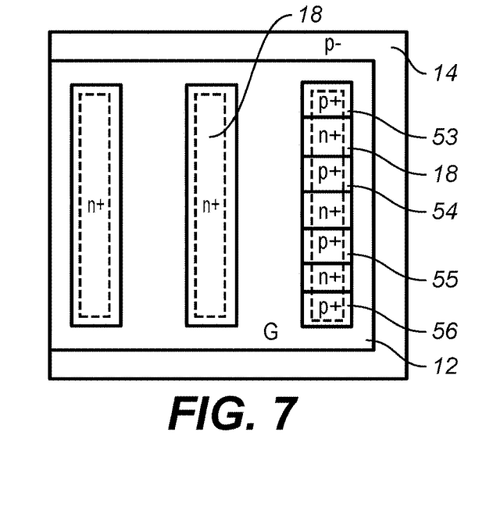

In FIG. 7, the p+ contact regions 53-56 are separated, with an n+ source region 18 between the p+ contact regions, so the current is well distributed along the edge cell while the current density is significantly reduced in the edge cell.

Figure 8:
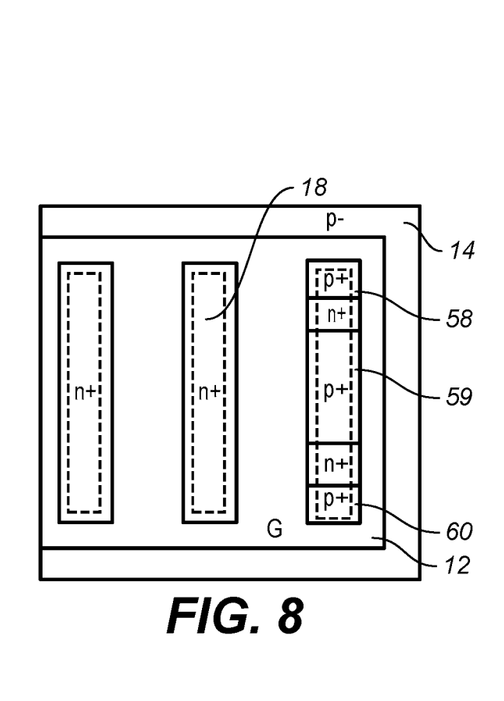

In FIG. 8, the p+ contact regions 58-60 are distributed and the center p+ contact region 59 is much larger.

Figures 9, 10:
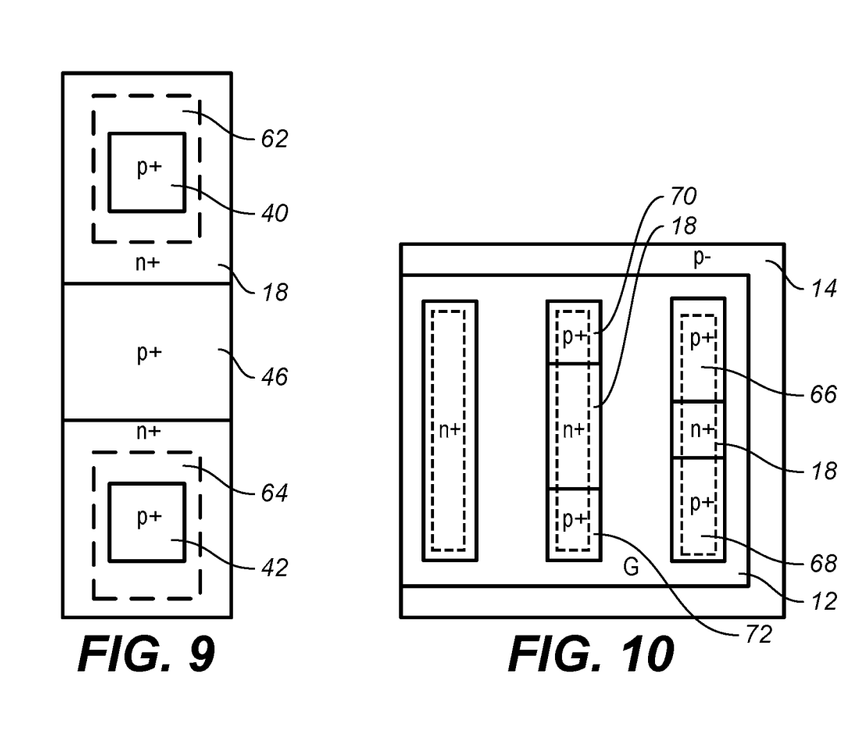
FIG. 9 is a top down view of an edge cell showing how the metal contact area can be reduced and distributed, compared to a larger contact area for the inner cells.
FIG. 10 illustrates how multiple edge area cells can be tailored to progressively reduce the current density in the edge area cells.

FIG. 9 is similar to FIG. 4, but the contact area (within the dashed lines) of the edge cell is divided into two separate contact areas 62 and 64. This adds contact resistance and controls the shorting of the p-well 14 to the n+ source region 18 in the edge area.

FIG. 10 illustrates how the current densities of the last few cells near the edge of the active region can be progressively lowered to optimize the robustness of the device. In FIG. 10, the sizes of the p+ contact regions 66 and 68 in the edge cell are larger than the p+ contact regions 70 and 72 in the adjacent inner cell.

The adjustment of the effective size of the n+ source region 18 in the edge cell(s) has been shown to controllably reduce the current density in the edge cell(s), and the optimal adjustment to obtain the desired total current and robustness of the device may be determined by simulation. Both the beta of the npn transistor and the conductance of the field effect device are lowered.

FIGS. 11-20 show various ways to controllably increase the threshold voltage of the vertical field effect device in the edge cell above that of the inner cells to reduce the current density in the edge cell. These techniques can be combined with the previous techniques.

Figure 11A:
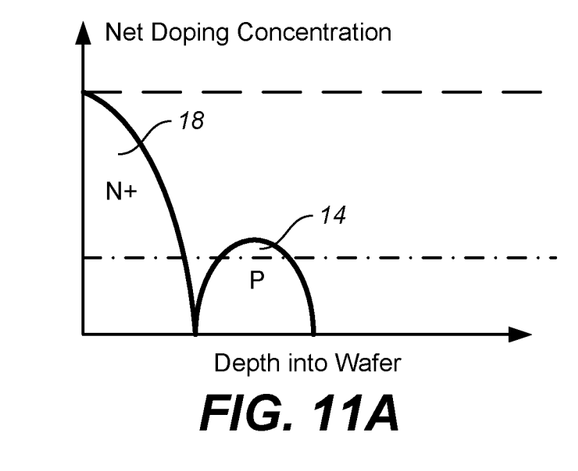
FIG. 11A illustrates a net doping profile for the source and well region of an edge cell.
Figure 11B:
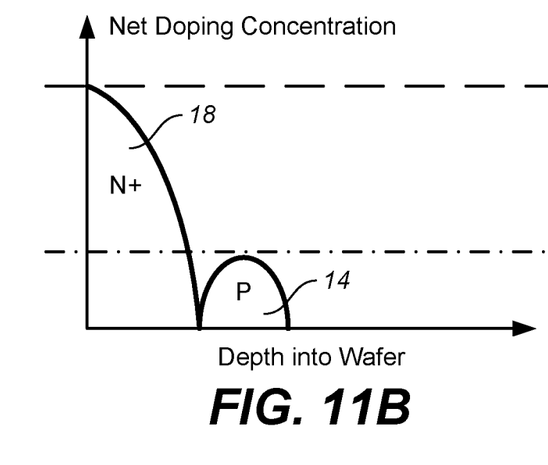
FIG. 11B illustrates a net doping profile for the source and well region of an inner cell, where the p-type dopant concentration in the p-well in the edge cell area is increased for increasing the threshold voltage of the field effect device in the edge cell to reduce its current density, in accordance with an embodiment of the invention using a second type of technique.

FIG. 11A shows relative net doping concentrations of an n+ source region 18 (at the top of the p-well 14) and the p-well 14 in the edge cell area. The x-axis is the depth into the semiconductor surface. FIG. 11B shows the relative net doping concentrations in the inner cells, where the p-well 14 is less doped. By raising the p-well 14 doping concentration (FIG. 11A) near the edge cell, the threshold voltage of the field effect device in the edge cell is increased, thus lowering the current density of the edge cell relative to the inner cells (having a lower p-well 14 doping concentration). This can be done with a counter-doping implant step in the edge cell area or an increased p-type doping in the inner cell area.

Figure 12A:
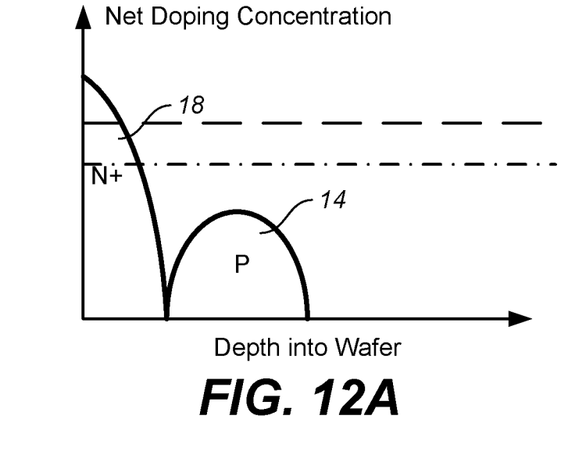
FIG. 12A illustrates a net doping profile for the source and well region of an inner cell.
Figure 12B:
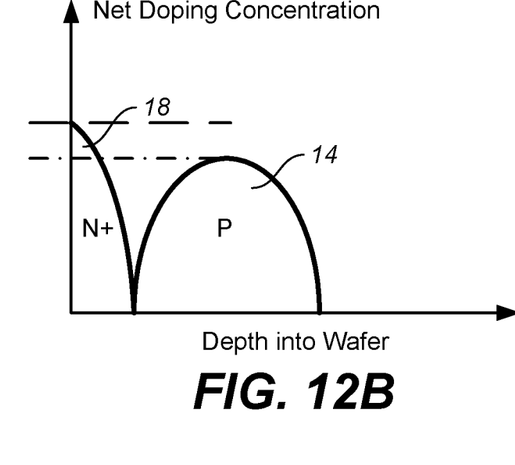
FIG. 12B illustrates a net doping profile for the source and well region of an edge cell, where the n-type dopant concentration in the source region of the edge cell is reduced, and the p-type dopant concentration in the p-well of the edge cell is increased to increase the threshold voltage of the field effect device in the edge cell to reduce its current density.

FIG. 12A shows relative net doping concentrations of an n+ source region 18 (at the top of the p-well 14) and the p-well 14 in the inner cells. The x-axis is the depth into the semiconductor surface. FIG. 12B shows the relative net doping concentrations in the edge cell area where the p-well 14 is more highly doped and the n+ source region 18 is less highly doped. By lowering the dopant concentration of the n+ source region 18 in the edge cell, the threshold voltage of the field effect device in the edge cell will be increased, thus lowering the current density of the edge cell relative to the inner cells (having a higher n+ source region 18 doping concentration). Further, by increasing the p-well 14 dopant concentration in the edge cell, the threshold voltage is further increased. This can be done with an extra p-type doping implant into the edge cell area, so the p-well 14 in the edge cell is more highly doped, and the n+ source region 18 in the edge cell is counter doped to reduce the net n-type dopant concentration in the n+ source region 18 in the edge cell.

FIGS. 13-16 illustrate another technique for raising the relative threshold voltage in the field effect device in the edge cell to lower the current density in the edge cell, relative to the current densities in the inner cells.

Figure 13:
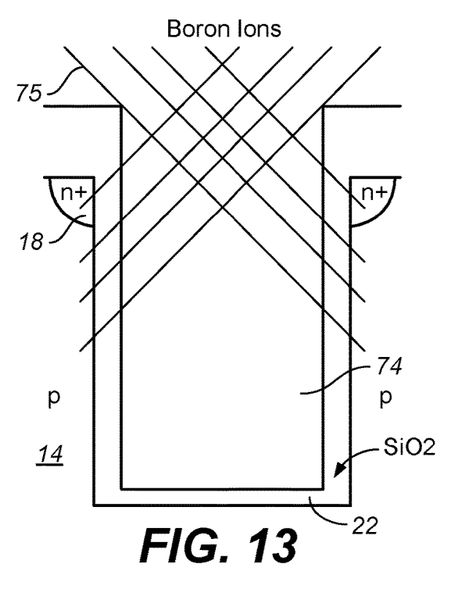
FIG. 13 is a cross-sectional view of the gate area of an edge cell, showing how the threshold voltage of the field effect device in the edge cell can be increased by an angled implant of boron into the inner walls of the gate trench to increase the p-type doping concentration in the p-well of the edge cell.

In FIG. 13, prior to the trenches 74 being filled with doped polysilicon, an angled boron (or other p-type dopant) implant 75 is performed to increase the p-type dopant concentration of the p-well 14 adjacent to the gates in the edge cell. The inner cells are masked from the implant. This increases the threshold voltage in the field effect device in the edge cell.

Figure 14:
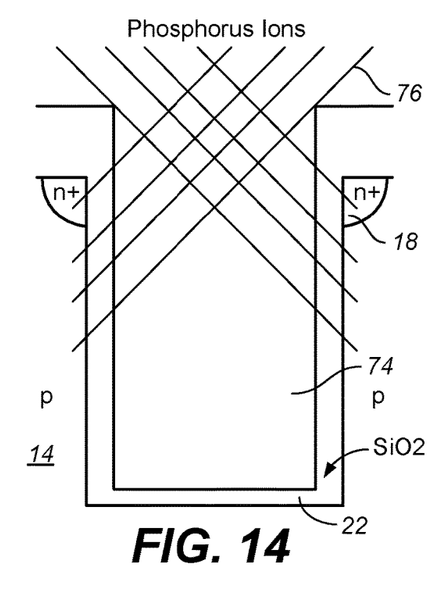
FIG. 14 is a cross-sectional view of the gate area of an inner cell, showing how the threshold voltage of the field effect device in the inner cell can be reduced (relative to the edge cell) by an angled implant of phosphorus into the inner walls of the gate trench to decrease the net p-type doping concentration in the p-well of the inner cell.

In FIG. 14, prior to the trenches 74 being filled with doped polysilicon, an angled phosphorus (or other n-type dopant) implant 76 is performed to decrease the net p-type dopant concentration of the p-well 14 adjacent to the gates in the inner cells, while the edge cell is masked from the implant. This results in the threshold voltage in the field effect device in the edge cell to be higher than the threshold voltage of the inner cells so that the edge cell has a lower current density.

Figure 15:
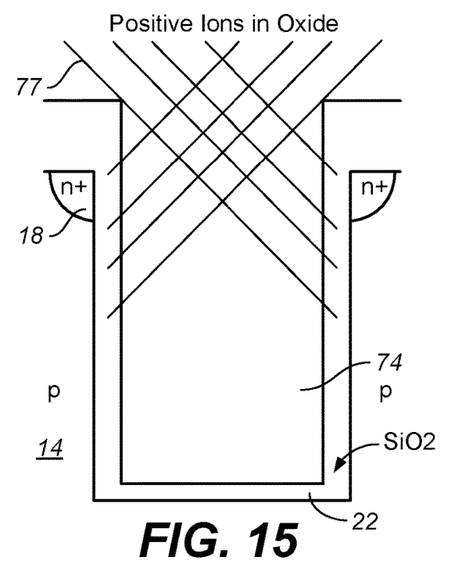
FIG. 15 is a cross-sectional view of the gate area of an inner cell, showing how the threshold voltage of the field effect device in the inner cell can be decreased (relative to the edge cell) by an angled implant of positive ions into the gate oxide.
Figure 16:
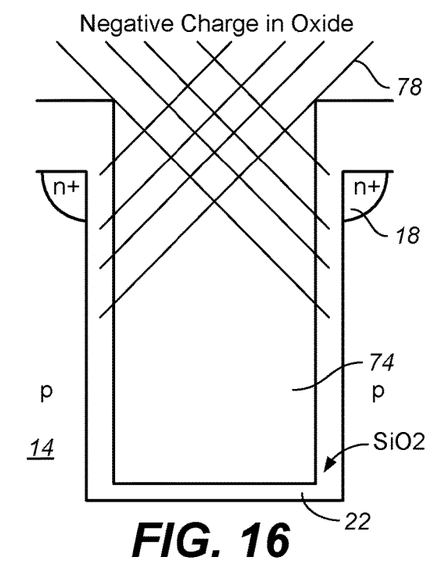
FIG. 16 is a cross-sectional view of the gate area of an edge cell, showing how the threshold voltage of the field effect device in the edge cell can be increased (relative to the inner cell) by an angled implant of negative ions into the gate oxide.

FIGS. 15 and 16 illustrate implanting positive ions 77 or negative ions 78 into only the thin gate oxide 22 of the trenches to provide a bias voltage that adds to or subtracts from the field generated by the gates. This will selectively control the threshold voltage of the field effect devices.

In FIG. 15, positive ions 77 are implanted into the gate oxide 22, except for the edge cell, to lower the threshold voltage of the inner cells. As a result, the edge cell will have a higher threshold voltage relative to the inner cells and have a lower current density.

In FIG. 16, negative ions 78 are implanted into the gate oxide 22, only in the edge cell, to raise the threshold voltage of the edge cell. As a result, the edge cell will have a lower current density.

Figure 17:
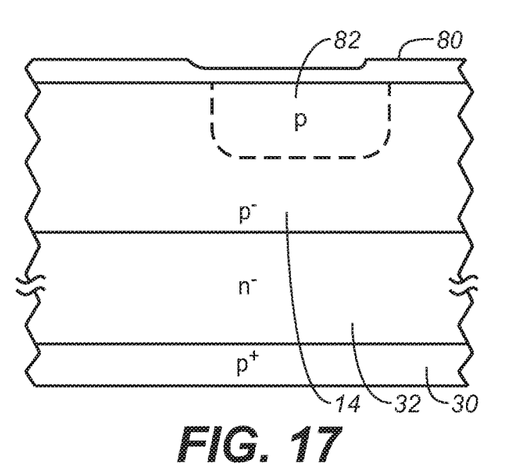
FIGS. 17 and 18 are cross-sectional views of an edge area, showing how implanting additional p-type dopants into the p-well around the edge cell increases the threshold voltage of the field effect device in the edge cell to reduce its current density
Figure 18:
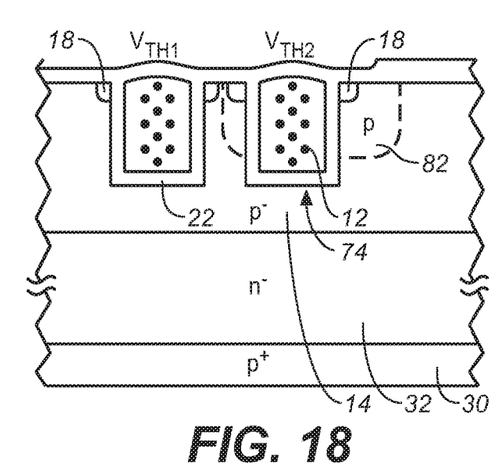

FIGS. 17 and 18 show one method for raising the threshold voltage of the field effect device in the edge cell by increasing the p-type dopant concentration of the p-well 14 only in the edge cell area. In FIG. 17, the top surface of the wafer is masked by a masking layer 80, and p-type dopants (e.g., boron) are implanted and diffused into the p-well 14 in the area of the edge cell to form a more highly doped p-type region 82.

In FIG. 18, the trenches 74 are formed, the n+ source regions 18 are formed, and the trenches 74 are filled with doped polysilicon to form the gates 12. The depth of the p-type region 82 is less than the depth of the trenches 74. As a result, the threshold voltage of the edge cell will be controllably higher than the threshold voltage of the inner cells. The dose of the p-type implant controls the threshold voltage.

In addition to, or instead of, the p-dopant implant into the edge cell area, an n-dopant implant may be performed in the area of the inner cells to lower the threshold voltage of the field effect devices in the inner cells. This result is a lower current density in the edge cell to improve the robustness of the device.

Figure 19:
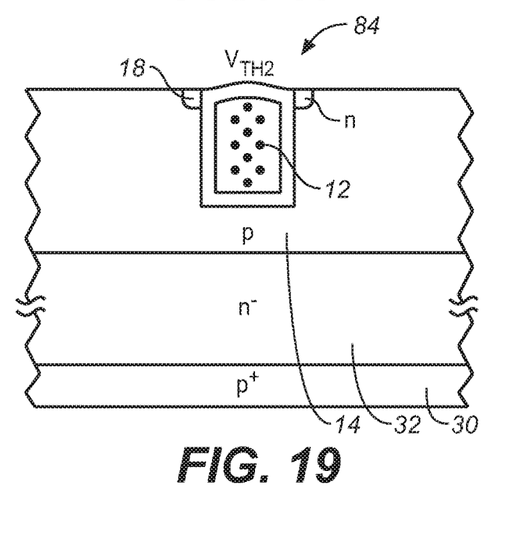
FIGS. 19 and 20 are cross-sectional views of an edge area, showing how an edge cell with a high threshold voltage can be independently formed to reduce its current density, followed by forming an inner cell with a lower threshold voltage.
Figure 20:
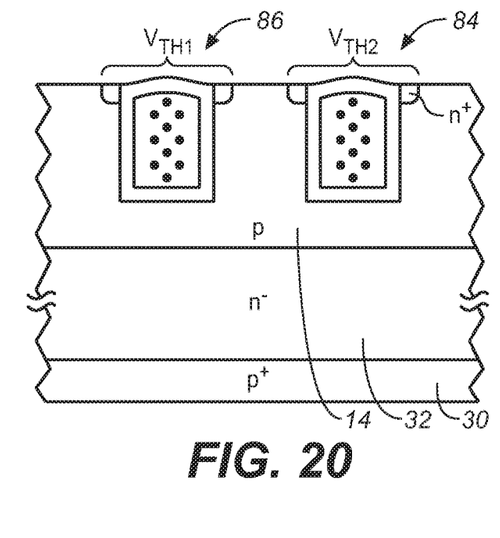

FIGS. 19 and 20 illustrate forming the edge cell separately from the inner cells to allow independent customization of the performance of the edge cell. This customization of the edge cell may be done using any of the techniques described above.

In FIG. 19, the edge cell 84 is formed to have a certain threshold voltage (Vth2) or a certain beta of its npn transistor. In FIG. 20, the inner cells 86 are formed to have a higher beta of their npn transistor and/or a lower threshold voltage (Vth1) of their field effect devices so that the inner cells 86 have a higher current density than the edge cell 84.

Figure 21:
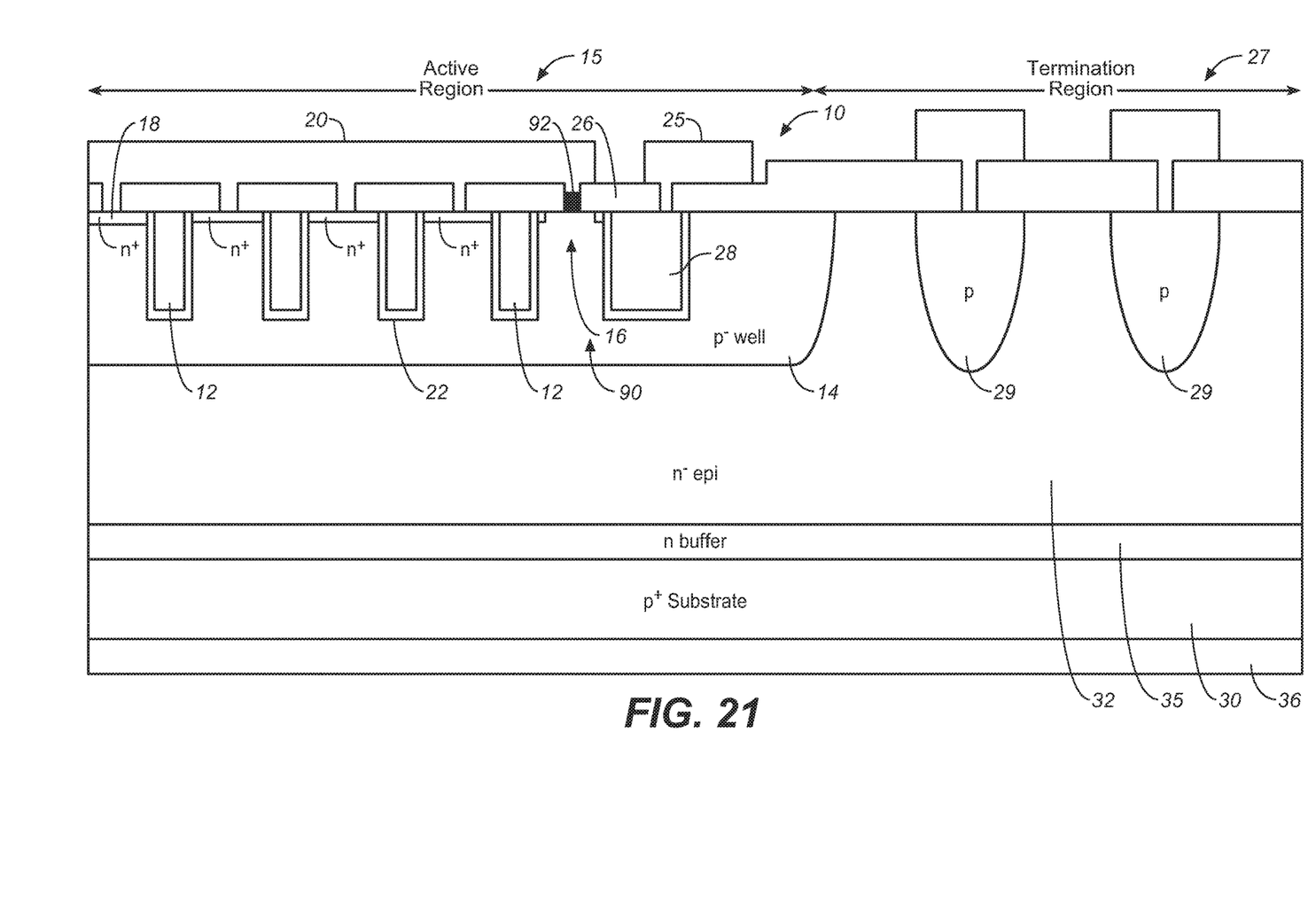
FIG. 21 is similar to FIG. 1, but a resistive layer is formed between the edge cell and the cathode electrode to add a series resistance to the edge cell to reduce its current density to improve the device's robustness, in accordance with a third technique for reducing the current density in the edge cell.

FIG. 21 illustrates a third technique for causing the edge cell 90 to have current density lower than that of the inner cells. FIG. 21 is the same as FIG. 1 except for a resistive layer 92 formed between the metal cathode electrode 20 and the top of the edge cell 90. The resistive layer 92 may be a resistive metal, a ceramic/metal (cermet) alloy, or other suitable resistive layer 92. The resistive layer 92 directly contacts the edge cell 90 between the gates 12 and 28 such as at the contact areas shown in FIGS. 3-10. By adding a series resistance to the edge cell 90, its current density can be precisely lowered relative to the current densities of the inner cells.

The various techniques can be combined to achieve the desired effects. Simulations may be used for determining the optimal implant depths, dosages, configurations, etc.

Opposite conductivity type devices are formed by making dopant types the opposite of those describe above. Thus, the bottom of the device may be the cathode.

Although all the examples given are in the context of modifications to the edge cell(s) of the insulated-gate device of FIG. 1, the concepts can be applied to any vertical, insulated-gate, cellular power switch, such as IGTOs, IGBTs, thyristors, and other insulated-gate controlled devices.

The various techniques are simple to implement and those skilled in the art can easily change masks or add process steps to implement the processes.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate controlled device formed as a die comprising:
    a first semiconductor layer of a first conductivity type;
    a second semiconductor layer of a second conductivity type overlying the first semiconductor layer;
    a third semiconductor layer of the first conductivity type overlying the second semiconductor layer;
    a fourth semiconductor layer of the second conductivity type overlying the third semiconductor layer;
    a matrix of cells comprising inner cells and at least one edge cell, wherein each of the inner cells and the at least one edge cell comprises an associated insulated gate within a trench formed at least within the third semiconductor layer to form vertical field effect devices in the inner cells and the at least one edge cell,
    wherein a vertical structure of npn and pnp transistors is formed, and conduction between the first semiconductor layer and the fourth semiconductor layer is controlled by a voltage applied to the gates;
    wherein the at least one edge cell is formed differently from the inner cells to conduct a current that is lower than a current conducted by an inner cell, when the insulated gate controlled device is in its on state; and the fourth semiconductor layer extending completely between opposing trenches in at least one first area of the at least one edge cell, and one or more highly doped contact regions of the first conductivity type extending completely between the opposing trenches in at least one second area of the at least one edge cell.

2. The device of claim 1 wherein the trenches do not extend below the third semiconductor layer.

3. The device of claim 1 wherein the one or more highly doped contact regions comprise a plurality of separated highly doped contact regions with regions of the fourth semiconductor layer between the highly doped contact regions.

4. The device of claim 1 further comprising the first electrode electrically contacting the inner cells and the at least one edge cell, wherein the first electrode contacts the edge cell in two or more separate areas.

5. The device of claim 1 wherein the at least one edge cell comprises a first edge cell and a second cell between the first edge cell and the inner cells, wherein the first edge cell is formed to conduct a first current lower than a second current conducted by the second cell and lower than a third current conducted by the inner cells.

6. The device of claim 1 further comprising an increased dopant concentration of dopants of the first conductivity type along sidewalls of the trench in the at least one edge cell to cause the field effect device in the at least one edge cell to have a threshold voltage that is greater than the threshold voltage of the field effect devices in the inner cells.

7. The device of claim 1 further comprising an increased dopant concentration of dopants of the second conductivity type along sidewalls of the trench in the inner cells to cause the field effect device in the at least one edge cell to have a threshold voltage that is greater than the threshold voltage of the field effect devices in the inner cells.

8. The device of claim 1 wherein the first semiconductor layer acts as an emitter for the pnp transistor, the second semiconductor layer acts as a base for the pnp transistor and a collector for the npn transistor, the third semiconductor layer acts as a base for the npn transistor and a collector for the pnp transistor, and the fourth semiconductor layer acts as an emitter for the npn transistor.

9. The device of claim 1 wherein the first electrode is a cathode electrode, the device further comprising an anode electrode formed on a bottom surface of the first semiconductor layer.

10. The device of claim 1 wherein the first semiconductor layer comprises a semiconductor substrate.

11. An insulated gate controlled device formed as a die comprising:
a first semiconductor layer of a first conductivity type;
a second semiconductor layer of a second conductivity type overlying the first semiconductor layer;
a third semiconductor layer of the first conductivity type overlying the second semiconductor layer;
a fourth semiconductor layer of the second conductivity type overlying the third semiconductor layer;
a matrix of cells comprising inner cells and at least one edge cell, wherein each of the inner cells and the at least one edge cell comprises an associated insulated gate within a trench formed at least within the third semiconductor layer to form vertical field effect devices in the inner cells and the at least one edge cell,
wherein a vertical structure of npn and pnp transistors is formed, and conduction between the first semiconductor layer and the fourth semiconductor layer is controlled by a voltage applied to the gates; and
wherein the at least one edge cell is formed differently from the inner cells to conduct a current that is lower than a current conducted by an inner cell, when the insulated gate controlled device is in its on state, by implementing one or more of the following:
providing positive ions in a gate dielectric layer along sidewalls of the trenches for the inner cells to cause the field effect device in the at least one edge cell to have a threshold voltage that is greater than the threshold voltage of the field effect devices in the inner cells, or
providing negative ions in the gate dielectric layer along sidewalls of the trench for the at least one edge cell to cause the field effect device in the at least one edge cell to have a threshold voltage that is greater than the threshold voltage of the field effect devices in the inner cells.

12. An insulated gate controlled device formed as a die comprising:
a first semiconductor layer of a first conductivity type;
a second semiconductor layer of a second conductivity type overlying the first semiconductor layer;
a third semiconductor layer of the first conductivity type overlying the second semiconductor layer;
a fourth semiconductor layer of the second conductivity type overlying the third semiconductor layer;
a matrix of cells comprising inner cells and at least one edge cell, wherein each of the inner cells and the at least one edge cell comprises an associated insulated gate within a trench formed at least within the third semiconductor layer to form vertical field effect devices in the inner cells and the at least one edge cell,
wherein a vertical structure of npn and pnp transistors is formed, and conduction between the first semiconductor layer and the fourth semiconductor layer is controlled by a voltage applied to the gates; and
a resistive layer between the edge cell and the first electrode electrically contacting the inner cells and the at least one edge cell, so that the at least one edge cell conducts a current that is lower than a current conducted by an inner cell, when the insulated gate controlled device is in its on state.

13. The device of claim 12 wherein the resistive layer is formed between the first electrode and the fourth semiconductor layer in the at least one edge cell.

14. The device of claim 13 wherein the resistive layer is one of a resistive metal or an alloy of ceramic and metal.

* * * * *